(12) United States Patent
Ishida et al.

(10) Patent No.: US 7,767,185 B2
(45) Date of Patent: Aug. 3, 2010

(54) METHOD OF PRODUCING A CARBON NANOTUBE AND A CARBON NANOTUBE STRUCTURE

(75) Inventors: Masahiko Ishida, Tokyo (JP); Toshinari Ichihashi, Tokyo (JP); Yukinori Ochiai, Tokyo (JP); Jun-ichi Fujita, Tokyo (JP)

(73) Assignee: NEC Corporation, Tokyo (JP)

( * ) Notice: Subject to any disclaimer, the term of this patent is extended or adjusted under 35 U.S.C. 154(b) by 825 days.

(21) Appl. No.: 10/595,195

(22) PCT Filed: Sep. 22, 2004

(86) PCT No.: PCT/JP2004/013851
§ 371 (c)(1), (2), (4) Date: Sep. 29, 2006

(87) PCT Pub. No.: WO2005/033006
PCT Pub. Date: Apr. 14, 2005

(65) Prior Publication Data
US 2007/0041886 A1  Feb. 22, 2007

(30) Foreign Application Priority Data
Sep. 30, 2003 (JP) .............................. 2003-340984

(51) Int. Cl.
*D01F 9/12* (2006.01)
(52) U.S. Cl. ................ 423/447.1; 423/445 R
(58) Field of Classification Search ............... 423/447.1, 423/445 R
See application file for complete search history.

(56) References Cited
U.S. PATENT DOCUMENTS 6,239,547 B1 * 5/2001 Uemura et al. ............... 313/495
6,479,028 B1 * 11/2002 Kaner et al. ................. 423/414
2005/0245390 A1 * 11/2005 Ota et al. ..................... 502/182
2005/0275331 A1 * 12/2005 Takai et al. .................. 313/311
2007/0110659 A1 * 5/2007 Hsiao ...................... 423/447.3
2007/0224107 A1 * 9/2007 Hikata ........................ 423/460

FOREIGN PATENT DOCUMENTS

JP  2003-017508  1/2003
JP  2003-238123  8/2003

OTHER PUBLICATIONS

J.Fujita, Observation and characteristics of mechnical vibration in three dimensioanl nanostructures, Dec. 2001, American Vacuum Society.*
J. Fujita et al. Graphitization of FE-doped amorphous carbon pillars grown by focused-ion-beam-induuced chemical-vapor deposition, Journal of Vacuum Science & Technology B, second series, vol. 20, No. 6,Nov. 2002; pp. 2686-2689.
Yoshikazu Homma et al. Growth of suspended carbon nanotube networks on 100-nm-scale silicon pillars; AApplied Physics Letters, vol. 81, No. 12; Sep. 16, 2002; pp. 2261-2263.
Seizo Kinoshita et al., "Ichi Seigio Seicho Carhon Noanotube ni yoru Shitsuon Coulomb Blockade", The Institute of Electronics, Information and Communication Engineers Gijutsu Kenkyu Hokoku, Jan. 29, 2002, vol. 101, No. 618, pp. 47 to 52.

* cited by examiner

*Primary Examiner*—Timothy C Vanoy
*Assistant Examiner*—Michelle Hou
(74) *Attorney, Agent, or Firm*—Whitham Curtis Christofferson & Cook, PC (57) ABSTRACT

An amorphous carbon rod (13) is formed in contact with a catalyst fine particle (11). The fine particle (11) is liquefied by heat treatment, and moved along the amorphous carbon rod (13). The trail of the movement is converted to a carbon nanotube.

12 Claims, 4 Drawing Sheets

METHOD OF PRODUCING A CARBON NANOTUBE AND A CARBON NANOTUBE STRUCTURE

TECHNICAL FIELD

The present invention relates to a method of producing a carbon nanotube, a carbon nanotube structure, and an device and a wiring using the carbon nanotube structure.

BACKGROUND ART

Carbon nanotubes, which have various characteristic properties due to their ideal one-dimensional structure such as inelastic electron and spin-conducting characteristics, mechanical strength, light-absorbing and emitting characteristics, heat-conducting property in addition to high electronic conductivity, high electron and hole mobility, are materials having a potential of various industrial applications.

Various production processes such as laser ablation method, chemical vapor-phase deposition method have been known as the methods of producing the carbon nanotube currently. However, it is difficult to control the diameter and length of the carbon nanotube by such conventional methods. Although it is an important technical challenge to place a carbon nanotube at a desired position in a desired direction in application of the carbon nanotube as a part such as electron devices, sensor or wiring, the conventional technology does not give an answer effectively overcoming such problem.

These problems are derived from the fact that metal fine particle catalyst prepared by self structuring and dispersed freely in vapor phase or on a substrate are used as the nucleus for growth in existing carbon nanotube growth methods. The diameter and the growth velocity of carbon nanotube vary significantly, depending on the size and shape of individual catalyst fine particles. As a result, a freely dispersed catalyst inevitably gives rise to a significant variation in growth condition and consequently in the shape, position, and orientation of the formed carbon nanotubes.

It is difficult to control the shape of catalyst metal fine particles at an accuracy of 10 nm or less and the orientation of the growing carbon nanotubes, even when catalyst fine particles are placed on a substrate by patterning in a lithographic process.

However, it is possible to control the shape of graphite structures having a diameter of approximately 100 nm that are significantly larger then common carbon nanotubes. Patent Document 1 and Nonpatent Document 1 disclose the methods of graphitizing a carbon structure due to catalytic effect of iron atoms by heating an amorphous carbon containing iron atoms partially or entirely. It is described that it is possible to produce a polycrystalline graphite structure and also to control the size thereof by the methods.

[Patent Document 1] Japanese Laid-open patent publication No. 2003-238123

[Nonpatent Document 1] J. Fujita, J. Vac. Sci. & Technol. B20, 2686 (2002)

DISCLOSURE OF THE INVENTION

However, the amorphous carbon structures prepared by the methods of Nonpatent Document 1 and Patent Document 1 have a large minimum-processing diameter at approximately 80 nm. It is because a vapor-phase deposition method of using focused ion beam is employed in preparation of the structure. As a result, the graphite structure which can be prepared also has a size similar to that above and is a polycrystalline substance irregular on the whole. It is thus difficult to prepare a structure having properties desirable as carbon nanotube.

The primary reason for inability of producing uniform carbon nanotube is that in the amorphous carbon graphitization process, generation of multiple crystal growth sites in its structure makes it a polycrystalline carbon. The second reason is that the size of the crystal growth site is smaller than that of the amorphous carbon structure.

An object of the present invention, which have been made in view of the circumstances above, is to provide a method of forming a carbon nanotube at a desired position in desired sizes.

Another object of the present invention is to provide a carbon nanotube structure having the properties inherent to carbon nanotube that is also superior in production stability.

According to the present invention, there is provided a method of producing a carbon nanotube, including preparing a carbon nanotube by introducing a catalyst substance in a carbon structure, making the catalyst substance move in the carbon structure, and crystallizing the trail of the catalyst substance.

According to the present invention, a carbon nanotube is prepared by moving a catalyst substance in a carbon structure previously prepared. Accordingly, it is possible to control the size and orientation of the carbon nanotube at high accuracy by adjusting the size and orientation thereof in the carbon structure. The carbon structure may be, for example, an amorphous carbon, and it is possible to control the size and orientation thereof and further form it on a desirable position of substrate. Thus in the present invention, it is possible to form a carbon nanotube in desired size and orientation at a desired position.

In the production process above, crystallizing the carbon structure may be performed after the carbon structure is fixed on a predetermined position of the substrate. In such a way, it is possible to form a carbon nanotube on a desired position of substrate favorably.

According to the present invention, there is provided a method of producing a carbon nanotube, including a step of preparing a substrate, forming a carbon structure at a position separated from the surface of the substrate, and preparing a carbon nanotube by making the catalyst substance move in the carbon structure and crystallizing the trail of the catalyst substance.

According to the present invention, it is possible to eliminate the various problems caused by interaction between the carbon nanotube and the substrate. For example, it is possible to reduce the parasitic capacity between the carbon nanotube and the substrate effectively. For that reason, the present invention provides the properties inherent to carbon nanotube sufficiently. The structure is also superior in production stability, and thus, carbon nanotubes in a desirable shape placed at a desired position can be obtained at high yield.

Various methods may be used as the method of forming a carbon structure at a position separated from the surface of substrate. An example thereof is a method of forming a carbon dot on the substrate and a carbon structure by using this. In such a case, the production method includes the following steps: forming first and second carbon dots on a substrate, forming a linear carbon structure of an amorphous carbon by allowing the amorphous carbon growth from the first carbon dot as the starting point until it reaches the second carbon dot, and obtaining a carbon nanotube by introducing a catalyst substance from the first or second carbon dot into the carbon structure, moving the catalyst substance along the carbon structure, and crystallizing the locus region. In accordance with such as configuration, it is possible to form a linear carbon structure which is to be carbon nanotube at a desired position in desired size and orientation because the amorphous carbon is grown from the first to second carbon dot. As a result, it is possible to control the position, size and orientation of the carbon nanotube at high accuracy.

In the present invention, the carbon structure may be heated during movement of the catalyst substance in the carbon structure. In addition, the catalyst substance may be liquefied by heating above. In this way, it becomes possible to form a carbon nanotube at high production stability.

In the present invention, the carbon structure is a linear structure, and the catalyst substance may be moved along the carbon structure. In such a case, the catalyst substance may be a catalyst particle, which has a diameter 0.5 to 3 times as large as the diameter of the linear structure. In this manner, it is possible to convert the almost entire region of the carbon structure into carbon nanotube effectively.

The production method according to the present invention is applicable to various structures including electronic elements and wirings and others.

According to the present invention, there is also provided a method of producing a transistor including forming a source electrode and a drain electrode respectively on both ends of the carbon nanotube structure as well as a gate electrode after forming a carbon nanotube structure by the method described above.

According to the present invention, there is also provided a method of producing a wiring structure made of a carbon nanotube, wherein the carbon nanotube structure is formed by the method described above.

According to the present invention, there is also provided a carbon nanotube structure, including a substrate and a carbon nanotube formed above the substrate, wherein the entire carbon nanotube is separated from the substrate.

The present invention also provides a carbon nanotube structure, including a substrate, first and second carbon dots formed on the substrate, and a carbon nanotube connecting the first to second carbon dots. The first or second carbon dot may be prepared, for example, with an aromatic hydrocarbon. The carbon nanotube can be formed by separating from the substrate.

These structures are superior in production stability, and it is possible to form a carbon nanotube formed at a desired position in a desirable shape at high yield.

It is also possible to eliminate various problems associated with interaction between the carbon nanotube and the substrate by forming a carbon nanotube separated from the substrate in the structure. For example, it is possible to reduce the parasitic capacity between the carbon nanotube and the substrate effectively. Thus in the present invention, it is possible to obtain the properties inherent to carbon nanotube. The structure is superior in production stability, and it is possible to form a carbon nanotube formed at a desired position in a desirable shape at high yield.

The structure according to the present invention is applicable to various structures including electronic devices and wirings and others. For example, the present invention provides the carbon nanotube structure and the wiring structures containing the carbon nanotube structure.

Applications of the present invention include the followings as example.

Firstly, solid devices that operate by using a carbon nanotube as charge-transferring medium such as channel, electrode, or wiring, including field effect transistor, bipolar transistor, shot-key diode, light-emitting device, light-absorbing device, electron-emitting device, and the like can be given.

Secondly, various devices that utilize the periodic structure of a carbon nanotube, including optical elements such as grating, photonic crystal, polarizor, reflector, attenuator, and optical filter; devices for physically filtering minute substances; devices having a comb or pin-support electrode structure that is used as a periodic charge-transfer medium; and the like can be given.

Thirdly, various devices utilizing mechanical function of the carbon nanotube including a probe of atomic force microscope, and electromechanical devices that use the carbon nanotube as a switch, sensor, or resonator while making it operate mechanically can be given.

Fourthly, devices and systems that use multiple devices in combination and the like can be given.

BREIF DESCRIPTION OF THE DRAWINGS

The objects described above and other objects and the features and advantages of the invention will become more evident, with reference to the following preferred embodiment and the following drawings attached thereto.

BEST MODE FOR CARRYING OUT THE INVENTION

In the method of producing carbon nanotube according to the present invention, a structure of the one-dimensional shape having a diameter or width of 80 nm or less (linear structure) is first used as the amorphous carbon structure used as the prototype for a desirable carbon nanotube.

A fine particle adjusted to a desirable size in contact with the amorphous carbon structure is used as the catalyst metal. The diameter of the particle is preferably almost the same as or up to twice as large as the diameter of the amorphous carbon structure.

The one-dimensional amorphous carbon structure is preferably graphitized by using a catalyst fine particle.

Its preparation temperature is with the range of approximately 100° C. from the temperature of the catalyst fine particle becoming liquid by forming solid solution with carbon, and the central temperature is decided according to the kind of the metal element used and the diameter of the fine particle. The temperature is approximately 600° C. when an iron fine particle having an average diameter of 20 nm is used as the catalyst metal.

An obstacle in producing a uniform carbon nanotube from an amorphous carbon structure is polycrystallization. To solve the problem above, it is first necessary to restrict the number of crystal growth sites. Ideally, it is important to prepare one carbon nanotube with one catalyst fine particle, as in conventional methods of producing carbon nanotube.

For that purpose, it is important to optimize the relationship between the size of amorphous carbon structure and the size of catalyst fine particle. That is, when the size of catalyst fine particle is too small, the fine particle move around in the amorphous carbon structure disorderedly, consequently leading to production of a nanotube lower in linearity and greater in the number of defects. It also leads to generation of an uncrystallized region.

Alternatively, when the catalyst fine particle is too large, a phenomenon prohibiting embedding of the catalyst fine particle in the amorphous carbon structure may occur. It is thus possible to produce a uniform nanotube efficiently, by adjusting the size of catalyst fine particle to a value preferably 0.5 to 3 times, more preferably 1 to up to 2 times, as large as the diameter of the amorphous carbon structure.

It is also important that the catalyst fine particle is liquid state in the process of nanotube-conversion reaction. The solubility limits of amorphous and graphite carbons in a liquid metal are different from each other, and thus, amorphous carbon is incorporated selectively therein, and as a result, excessive carbon separates out from the metal fine particles.

As a result, if the metal has a catalytic activity of graphitization, the metal catalyst realizes a growth mechanism of graphitizing the amorphous carbon while it is moving around spontaneously. The action is realized when all of the catalyst metal fine particle, or part thereof such as surface, is liquefied.

In addition, the melting point of catalyst fine particle declines in inverse proportion to the diameter of the fine particles. Thus, when nanotubes are prepared from a fine particle having a diameter of approximately 5 to 20 nm, the reaction is carried out at a lower temperature of approximately 400° C. to 600° C.

Hereinafter, embodiments of the present invention will be described with reference to drawings. In the embodiments described below, a uniform carbon nanotube is prepared by solid-phase growth of an amorphous carbon structure. The carbon nanotubes obtained are well controlled in diameter, length, position, and orientation direction at high accuracy, and have various properties inherent to carbon nanotube such as high electronic conductivity, high mobility, inelastic electron and spin conductivities, mechanical strength, high heat conductivity, and light absorption and emission; and thus are applicable to various functional devices.

Hereinafter, the carbon nanotube represents a multi-walled carbon nanotube, unless specified otherwise.

First Embodiment

The method of producing a carbon nanotube according to this embodiment will be described below.

First, a metal fine particle to be a catalyst is placed on a substrate forming a carbon nanotube. The material for the substrate is not particularly limited, and may be selected from various materials such as silicon, according to applications.

The catalyst metal is selected from metals higher in the activity of graphitizing reaction such as Fe, Ni, Co, Cr, and Mo. Alternatively, an alloy containing at least one of these metals may also be used. For example, even an alloy of the metal above and a metal having no activity of graphitizing reaction such as FePt or NiCu alloy is occasionally effective, because such an alloy sometimes has an activity higher than the constituent single metal such as Fe or Ni. In addition, an alloy containing various metals often has an effect of lowering melting point, and is thus effective.

The metal fine particle is commonly prepared by a so-called vapor-phase, liquid-phase, or solid-phase method as methods of producing the metal fine particle. The vapor-phase methods include a chemical vapor-phase separation method, a laser ablation method, an atomizing method of preparing fine particles by spraying a melted metal into vapor phase, and the like. Alternatively, the liquid-phase methods include methods of separating and precipitating fine particles by pH adjustment, preparing a cluster of metal-containing molecules, and preparing fine particles by using colloid or micelle dispersed in a solution, and the like.

One of the solid-phase methods, a solid-phase crystallization method, is used according to this embodiment. The advantage of this method is that it is possible to control the region where the fine particle is formed and the size of the fine particle very effectively, by previously patterning the solid-phase reaction field where crystallization is introduced, for example, in a lithographic process.

Specifically, a focused ion beam-induced chemical vapor-phase deposition method or an electron beam-induced chemical vapor-phase deposition method is used. Amorphous carbon dots containing a desirable metal species are prepared by using the method. The preparative procedure is as follows.

Favorable precursor material as carbon sources used in the vapor-phase deposition method include aromatic hydrocarbons; and particularly favorable are aromatic hydrocarbon having fused rings. Use of an aromatic hydrocarbon that is solid at room temperature and has a vapor pressure of $10^{-5}$ Pa or more when heated to 50° C. or more is preferable. Typical examples thereof include phenanthrene, pyrene, and the like. Similarly, a metal-containing compound that is solid at room temperature and has a vapor pressure of $10^{-5}$ Pa or more when heated to 50° C. or more is used as the metal source. Examples thereof include metallocenes and the like. Phenanthrene as the carbon sourcene and a ferrocene which is an iron metallocene as metal sources are used respectively in this embodiment.

The precursor materials are placed respectively in separate reservoirs equipped with a heating mechanism, and fed into a growth chamber under vacuum through a nozzle similarly equipped with a heating mechanism. Typical temperature of the reservoir is 80° C. for phenanthrene and 65° C. for ferrocene.

The excitation beam used is a $Ga^+$ ion beam accelerated at 30 keV. The beam current is 1 pA, and the beam width at the focal point is approximately 7 nm. Each precursor is sublimated in the reservoirs, and a deposit is formed on the area of a substrate in the range of 40 nm from the center of beam irradiation point by spraying the gases on the substrate and irradiating the ion beam thereon.

The growth velocities of precursor materials then are approximately 50 $Å^3$ and 8 $Å^3$ with respect to the incident ion. The content of iron with respect to carbon in the deposit formed from ferrocene is identical approximately with the ratio of the number of atoms in the molecule, and is approximately 12% by volume ratio.

Observation under a high-resolution transmission electron microscope reveals that iron is dispersed uniformly in the atomic state or in the state of fine particles of 5 nm or less in diameter in the amorphous carbon of the deposit.

For example, a deposit containing precursor materials in amounts approximately proportional to the growth velocities thereof is formed when these precursors are supplied simultaneously, and the iron content therein becomes approximately 1 vol %. It is possible to keep the iron content at the optimal value, by modifying the temperature of each reservoir. It is also possible to control the iron content by changing the precursor material for growth in a stepwise manner.

Figure 1:
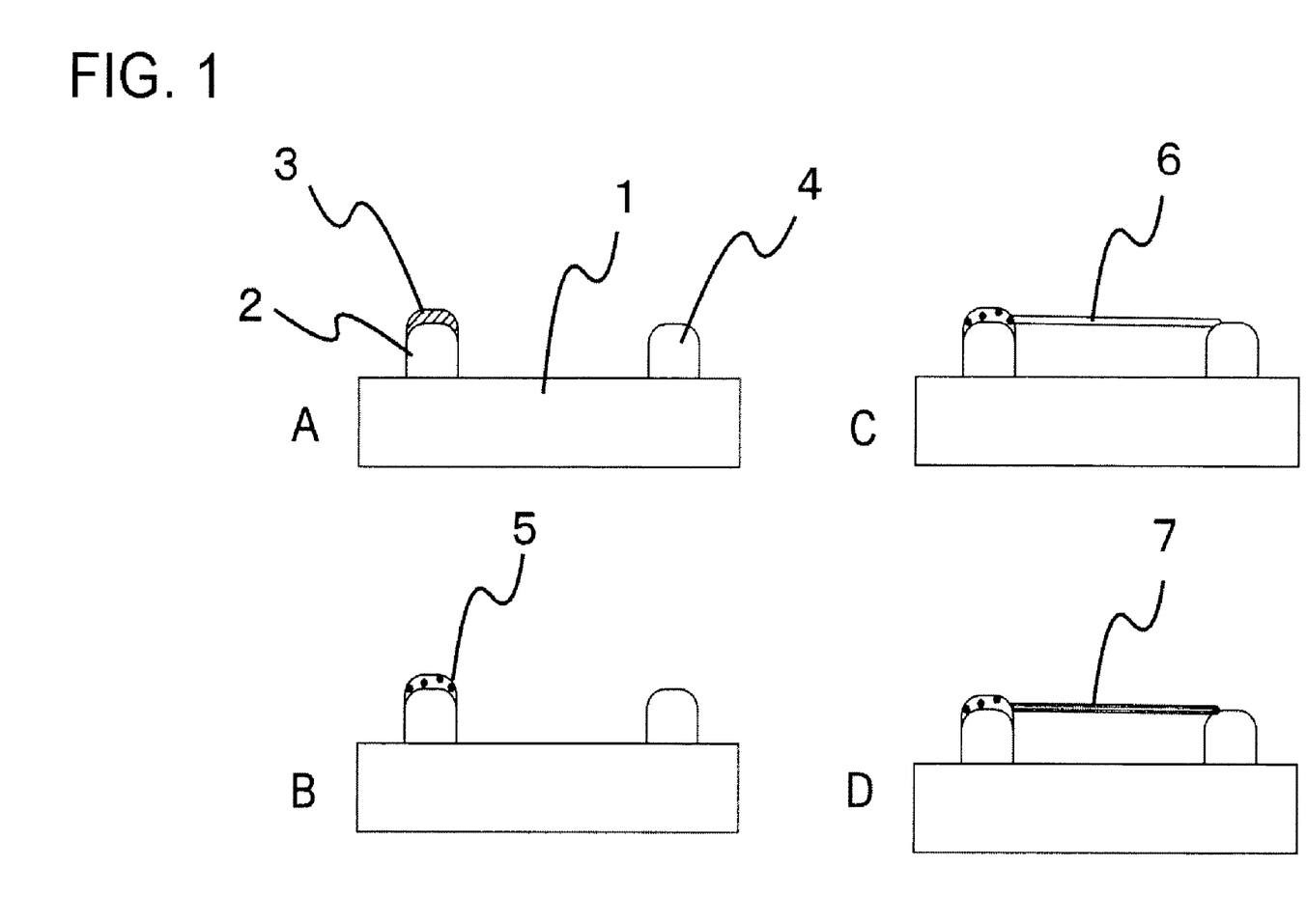
FIG. 1 is a schematic view illustrating the method of producing carbon nanotube according to the first embodiment of the present invention.

In the present embodiment, a dot 2 having a diameter of 100 nm and a height of 120 nm is obtained at the terminal position for placing a carbon nanotube on silicon oxide substrate 1 which is a substrate for preparation of carbon nanotube, by firstly irradiation of phenanthrene for 4 seconds. An iron-containing carbon film 3 having a thickness of approximately 20 nm is prepared by additionally performing growth for two seconds using ferrocene on the same position. Then, a dot 4 having a similar diameter of 100 nm and a height of 100 nm is formed by using only phenanthrene at a position 500 nm separated from the dot (FIG. 1A).

Observation under a scanning electron microscope of the dot 2, after heating under vacuum at 600° C. for 5 minutes and cooling gradually, confirms that there has been formed fine particles 5 of 10 to 15 nm in diameter and which is different in contrast on the surface of the dot subjected to deposition using ferrocene. The fine particles are made of iron and iron carbide or iron oxide (FIG. 1B).The surface carbon film may be eliminated by introducing oxygen as needed continuously in the high-temperature state or subjecting it to an oxygen plasma treatment after the vacuum annealing. The temperature of heat treatment may be adjusted according to the size of the fine particles prepared. For example, a high heating temperature of approximately 700° C. is favorable for forming larger fine particles of approximately 40 nm in diameter. Alternatively, a temperature of approximately 550° C. is favorable for forming fine particles of 10 nm or less. The size and density of the fine particles may also be controlled by modifying the heating period and the concentration of iron atom contained.

Subsequently, phenanthrene is introduced into the observation chamber of a scanning electron microscope for vapor-phase deposition by electron beam. Phenanthrene may be introduced, for example, firstly by a method of spraying through a gas nozzle similarly to the focused-ion-beam chemical-vapor-phase-deposition method described above, or secondly by a method of introducing a phenanthrene-adsorbed substrate, a porous substance, or the like at a position close to the sample. Phenanthrene, which has a low vapor pressure at room temperature and is more likely to be adsorbed on the substrate surface at room temperature, is a substrate suitable for the second method.

In the present embodiment, 1 mg or less of phenanthrene is deposited and introduced on a silicon substrate of 3×3 $mm^2$ by the second method. The change in vacuum between before and after introduction is $1\times10^{-5}$ Pa or less.

Then, the dot prepared only with phenanthrene is scanned with an electron beam at a speed of approximately 200 nm per minute, by using a probe beam of an in-lens type high-resolution electron microscope (accelerating voltage: 15 keV, beam current: 60 pA, and beam diameter: 2 nm or less) from one of the iron-containing fine particles as a starting point.

Arrival at the end-point dot can be confirmed by monitoring the amount of the secondary electron emitted by electron beam irradiation. In such a case, the end-point dot, which is projected, exhibits greater secondary electron emission than the area surrounding it. Arrival at the end point is thus confirmed from the characteristics. After scanning with the electron beam, it is confirmed that formation of an amorphous carbon wire 6 having a thickness of 10 nm so as to bridge the gap between the starting and end-point dots (FIG. 1C).

Heat treatment of the sample at 650° C. for 15 minutes resulted in migration of the fine particles 5 toward the dot 4, and the amorphous carbon wire 6 is crystallized in association therewith. Observation under a transmission electron microscope confirms that a multilayer carbon nanotube 7 having a thickness of approximately 13 nm is formed (FIG. 1D). The carbon nanotube is spatially separated from the substrate and has a shape extending almost in parallel with the substrate.

The amorphous carbon wire prepared by electron-beam-excited deposition method has a minimum diameter of approximately 5 nm, when an electron beam having a diameter of approximately 2 nm is used. Thus, it is possible to prepare an amorphous carbon wire having a minimum diameter of 3 to 4 nm by using a thinner electron beam. Because it is possible to make the wire thinner, for example by oxygen plasma treatment, it would be possible, in such a case, to prepare an amorphous carbon wire having a minimum diameter of 1 nm. A single-walled carbon nanotube seems to be formed then by the nanotube conversion.

Advantages of preparing a rod while the amorphous carbon wire is separated from the substrate include that it is possible to reduce the deposition due to backward scattered electrons reflected beam from the substrate and thus prepare a thinner amorphous carbon wire and that it is possible to advance the nanotube conversion efficiently by reducing the reaction between the substrate and metal fine particles.

Hereinafter, the principle of the progress of nanotube-conversion reaction will be described with reference to FIGS. 2 and 3.

In FIG. 2A, the substrate is prepared by heat treatment of an iron-containing amorphous carbon layer prepared by using ferrocene. The heat treatment resulted in aggregation of iron atoms to form a fine particle 11. The amorphous carbon is converted to polycrystalline graphite 12 by the catalytic action of iron.

The reason for the graphitization is transition of an amorphous phase formed in the non-equilibrium state, which is generally in a metastable state, to the stabilized graphite phase by heat treatment and the catalytic action of iron.

In addition in FIG. 2A, an amorphous carbon rod 13 in contact with a fine particle 11 is formed according to the procedure of the embodiment.

Further heat treatment of the substrate leads to melting and liquefaction of the iron fine particle. FIG. 3 shows a simplified phase diagram of the iron-carbon binary system. Metals such as iron, cobalt, and nickel have usually a similar phase diagram. Iron and carbon become liquid at approximately 1150° C. or more in the bulk state, but fine particles thereof of approximately 10 nm in diameter presumably have an effective melting point of as low as 600° C.

Figure 3:
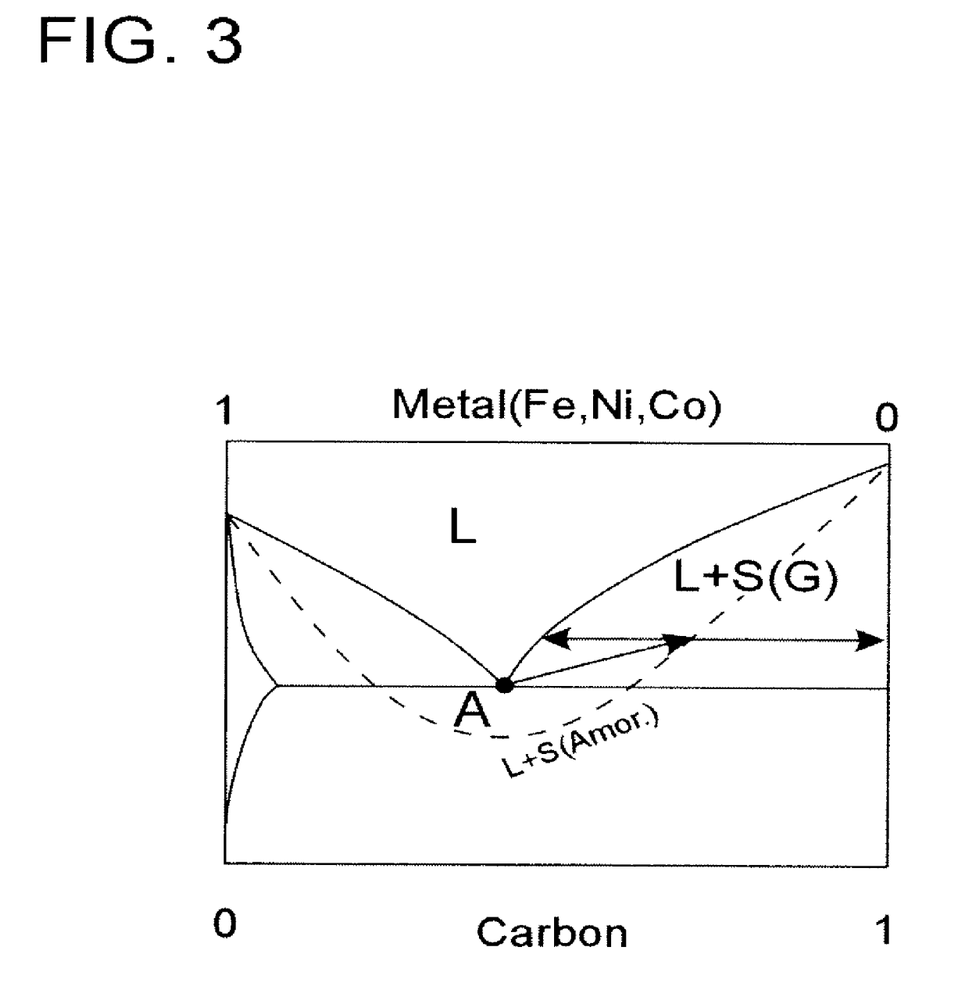
FIG. 3 is a schematic view illustrating the state of the catalyst during the carbon nanotube-conversion reaction according to the first embodiment of the present invention.

A in FIG. 3 indicates a state where iron fine particle is liquid. The dissolved iron fine particles adsorb carbon present in the surrounding area, and enter over the boundary line into the mixed phase region of liquid and graphite phases, as indicated by the arrow in phase diagram. The solidification point in a metastable phase such as amorphous phase is normally lower than that in the crystalline phase, and shows a curve similar to that indicated by the dotted line in phase diagram. Accordingly, the amorphous carbon is incorporated selectively in the fine particles until the phase reaches the curve. In addition, the temperature of the fine particles rises slightly by the heat of solution at the same time.

Incorporation of the amorphous carbon occurs at the interface 14 between the fine particle 11 and the amorphous carbon rod 13 (FIG. 2A). In the process, the interface between the fine particle 11 and the amorphous carbon phase is withdrawn in the rightward direction in FIG. 2A.

Figure 2:
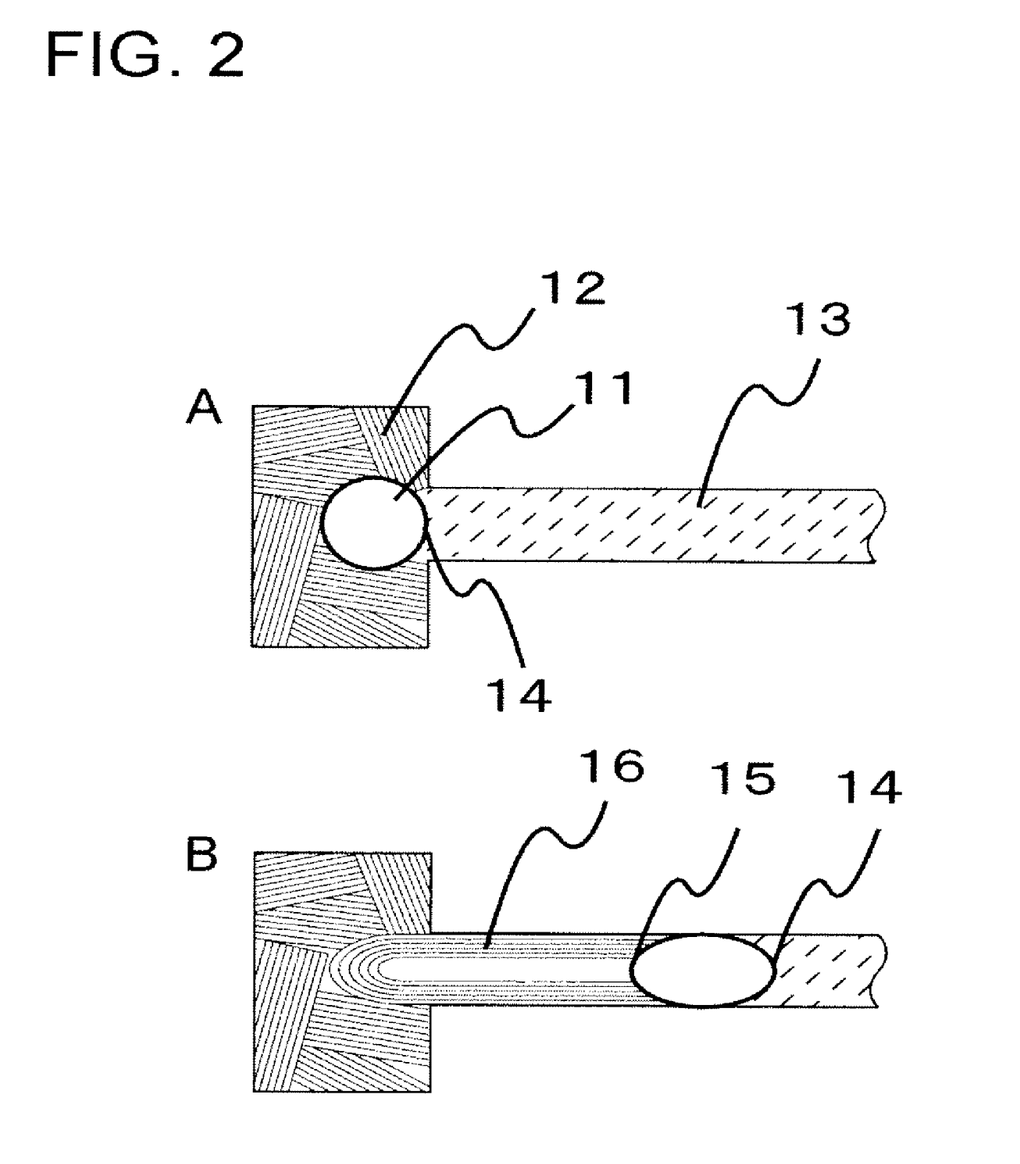
FIG. 2 is a schematic view illustrating the carbon nanotube-conversion reaction according to the first embodiment of the present invention.

The graphite carbon phase 16 separates out at the left interface 15 of the fine particle 11 in the during (FIG. 2 B). The phenomenon can be easily understood, considering that the graphite phase separates out almost without any energy barrier by the catalytic action of iron, the fine particle incorporates carbon in an amount equal to or more than the solubility limit of graphite phase because of incorporation of the amorphous layer, and the fine particle has a force moving in the direction toward the amorphous carbon phase.

As a result, as shown in FIG. 2B, it is possible to make the fine particle move spontaneously only in the direction and consequently to form a carbon nanotube, by dissolving the fine particle and restricting the region where the fine particle becomes in contact with the amorphous carbon at the same time. That is, according to the principle of the present invention, the carbon nanotube prepared is determined by the shape of its original amorphous carbon.

It is thus possible to control the thickness, length, position, and direction of carbon nanotube, by controlling the shape of the amorphous carbon structure. Further, it is possible to prepare a more complicated shape, for example a structure bent at any position, a structure having an arbitrary curvature, or a structure in which such deformations is occurred periodically. In addition, these structures can be designed not only in a plane in parallel with the substrate but also in a plane in the direction perpendicular to the substrate.

The structure of the carbon nanotube and the production method thereof described in the embodiment have the following characteristics.

First, by subjecting solid-phase growth to a carbon nanotube, which is prepared by vapor-phase growth method, it is possible previously to restrict the region of growth, and as a result, to control the parameters needed in production of a carbon nanotube device such as length, diameter, position, and direction.

Secondly, it is possible to advance the nanotube-conversion reaction effectively by making the catalyst metal move spontaneously toward the direction of proceeding irreversible reaction from amorphous phase to graphite phase, by making the most of the difference in solubility limit into the liquefied catalyst metal between the amorphous and graphite phase carbons as well as in free energy between the phases.

Thirdly, it is possible to advance the solid-phase growth of carbon nanotube effectively by optimizing the relationship between the amorphous structure and the number and size of the catalyst metal fine particles.

Fourthly, it is possible to provide a method of allowing growth of carbon nanotube at a growth temperature of 600° C. or lower, by using catalyst fine particles of 20 nm or less in size and multi-component metal fine particles containing carbon.

The carbon nanotube structure obtained in the embodiment can be applied to various electronic devices and wiring structures and others. For example, it is possible to obtain a nano-wiring structure by connecting multiple pieces of the structure shown in FIG. 1D. Alternatively, it is possible to obtain a nano-wiring structure by converting amorphous carbon patterned in a predetermined shape on a substrate into carbon nanotube.

Second Embodiment

In the present embodiment, metal catalyst fine particles are prepared according to a method of patterning by a lithographic process. Therefore, it relates to a production method favorable for mass production of carbon nanotubes and the devices containing that.

First, a window of positive resist is formed on the terminal position for placing a carbon nanotube of a substrate for preparation of carbon nanotube. For example, it is possible to form a window of 10 nm in diameter easily in a process forming a three-layer resist, for example, of PMMA/Ge/PMMA.

In addition, it is possible to form an iron thin film only at a desirable position by vapor depositing a catalyst metal to a thickness of approximately 1 nm on the entire substrate surface and removing the undesirable regions by lift off and to form metal catalyst fine particles of 1 to 5 nm in diameter by heating the substrate further to approximately 600° C.

It is also possible to coat metal fine particles prepared by a liquid- or solid-phase method over the entire substrate as they are dispersed in a solvent that does not corrode the resist film.

It is possible to obtain fine particles without heat treatment by removing the undesirable regions subsequently by lift off. It also has an advantage in its better controllability of fine particle diameter.

Alternatively, it is possible to apply fine particles directly by patterning using a negative resist. By adding metal fine particles prepared for example by a liquid- or solid-phase method and an metal-containing organic molecule to a high-resolution negative resist such as calixarene resist, it is possible to form a pattern of the metal-containing amorphous carbon by a dot-pattern preparation procedure using a common resist. That is, it is possible to form a resist pattern of the carbon structure.

In the procedure described above, it is possible to obtain significant advantages in the positional accuracy of patterning and the size control, cost, throughput of fine particles, and others, by forming a pattern with metal fine particles, over the processes using focused ion beam.

Third Embodiment

Figure 4:
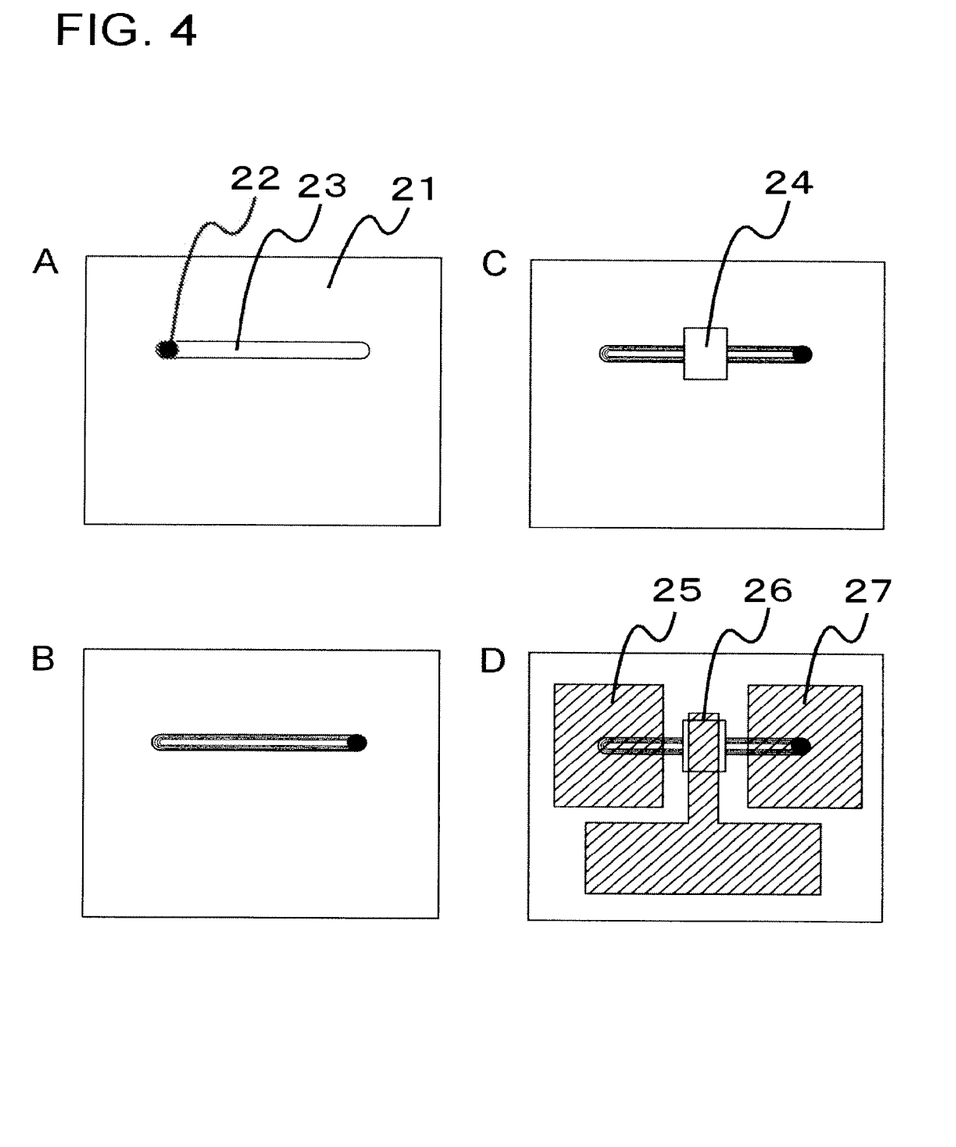
FIG. 4 is a schematic view illustrating the method of producing carbon nanotube according to the third embodiment of the present invention.

The present embodiment will be described in detail with reference to FIG. 4.

The embodiment relates to a method for preparation of nanotube amorphous carbon in which patterning is performed by a lithographic process, therefore, indicates a production method suitable for mass production of carbon nanotubes and the devices containing that.

First, a substrate 21 having a pattern made with catalyst metal fine particles 22 of approximately 8 nm in diameter is prepared by the method described in the first or second embodiment. The substrate 21 used is a plate of silicon oxide (FIG. 4A).

An organic high-resolution negative resist film of calixarene or polymethylstyrene is then prepared. Then, a one-dimensional structure 23 covering a fine particle 22 is formed by exposing and developing the one-dimensional region. In the embodiment, an amorphous carbon wire having a height of 5 nm, a width of 7 nm, and a length of 200 nm is formed by electron beam exposure by using chloromethylated calixarene. It is further converted to a nanotube by the method described in the first embodiment (FIG. 4B).

A gate insulating film 24 is then formed (FIG. 4C) as well as a source electrode 25, a drain electrode 27 and a gate electrode 26 are formed (FIG. 4D), for example by the method described in Japanese Laid-open patent publication NO. 2003-17508 filed by the applicant, to give a field-effect transistor containing carbon nanotubes as its channel.

The source electrode 25 and the drain electrode 27 are made of a metal. Examples of the metals include gold, silver, platinum, titanium, titanium carbide, tungsten, aluminum, molybdenum, chrome and the like. The source electrode 25 or the drain electrode 27 may be connected to the tip or the side wall of the carbon nanotube. It may be heat-treated at a temperature in the range of 300° C. to 1,000° C. during electrode formation for improvement of electrical connection.

The gate electrode 26 may be formed directly on the carbon nanotube, or alternatively, the gate electrode may be formed via a thin insulating film. Examples of the insulating films include films of an inorganic material such as silicon oxide, silicon nitride, aluminum oxide, titanium oxide, or calcium fluoride; films of a polymeric material such as acrylic resin, epoxy resin, polyimide, or Teflon (™); films of a self-structured molecule such as aminopropylethoxysilane; and the like. The side wall of carbon nanotube, which has no dangling bond, is chemically inactive, and thus, there is a certain degree of freedom in selecting the insulator.

An electrically conductive material is used as the constituent material for the gate electrode 26. Examples thereof include gold, silver, platinum, titanium, titanium carbide, titanium nitride, tungsten, tungsten silicide, tungsten nitride, aluminum, molybdenum, chrome, and polycrystalline silicon, or the combinations thereof. Alternatively, carbon nanotube may be used as the gate electrode. In such a case, it is possible to obtain a gate extremely shorter in length. The carbon nanotube for use as the gate electrode may be a single-layer, multilayer, or metal-inclusion carbon nanotube. Metallic carbon nanotubes are preferable.

A carbon nanotube having a pre-designed size and orientation is formed at a pre-designed site of transistor in the embodiment. Accordingly, it is possible to obtain a transistor of which the carbon nanotube properties reliably expresses and which has a stabilized device performance. Although a field effect transistor is described as an example in this embodiment, the present invention may also be applied to a single-electron transistor.

The present invention has been described so far with reference to embodiments. The embodiments are only aimed at providing examples, and various modifications are possible, and it should be understood for those skilled in the art that such modifications are also included in the scope of the present invention.

For example, a multilayer carbon nanotube has been described as an example in the embodiments above, but a single-layer carbon nanotube may be used instead. In addition, it is obvious, from the similarity in the growth mechanism between semiconductor crystalline thin wire and carbon nanotube, that solid-phase growth with a melted metal catalyst along a solid precursor material pattern processed in the thin wire shape is also possible with semiconductor materials in the group IV and the groups III to V such as Si, Ge, GaAs, GaP, InAs, InP, InGaAs, and InGaAsP.

The invention claimed is:

1. A method of producing a carbon nanotube, comprising:
preparing a one dimensional carbon structure;
introducing a catalyst substance into said one dimensional carbon structure;
making said catalyst substance move in said one dimensional carbon structure; and
crystallizing a trail region of movement of said catalyst in said one dimensional carbon structure, wherein said step of crystallizing converts said trail region to a carbon nanotube, wherein said crystallizing said trail region is performed after said one dimensional carbon structure is fixed on a predetermined position of a substrate.

2. A method of producing a carbon nanotube, comprising:
preparing a one dimensional carbon structure, wherein said one dimensional carbon structure is formed by a vapor-phase deposition method of using a charged particle beam as an excitation source;
introducing a catalyst substance into said one dimensional carbon structure;
making said catalyst substance move in said one dimensional carbon structure; and
crystallizing a trail region of movement of said catalyst in said one dimensional carbon structure, wherein said step of crystallizing converts said trail region to a carbon nanotube.

3. A method of producing a carbon nanotube, comprising:
preparing a one dimensional carbon structure, wherein said one dimensional carbon structure is prepared by a vapor-phase deposition method of using an aromatic hydrocarbon compound as a precursor material;
introducing a catalyst substance into said one dimensional carbon structure;
making said catalyst substance move in said one dimensional carbon structure; and
crystallizing a trail region of movement of said catalyst in said one dimensional carbon structure, wherein said step of crystallizing converts said trail region to a carbon nanotube.

4. A method of producing a carbon nanotube, comprising:
preparing a one dimensional carbon structure, wherein said one dimensional carbon structure is a resist pattern;
introducing a catalyst substance into said one dimensional carbon structure;
making said catalyst substance move in said one dimensional carbon structure; and
crystallizing a trail region of movement of said catalyst in said one dimensional carbon structure, wherein said step of crystallizing converts said trail region to a carbon nanotube.

5. A method of producing a carbon nanotube, comprising:
preparing a substrate;
forming a one dimensional carbon structure at a position separated from a surface of the substrate;
preparing a carbon nanotube by making a catalyst substance move in the one dimensional carbon structure; and
crystallizing a trail region of movement of said catalyst in said one dimensional carbon structure, wherein said step of crystallizing converts said trail region to said carbon nanotube.

6. The method of producing a carbon nanotube according to claim 5, wherein said one dimensional carbon structure is heated when said catalyst substance is moved in the carbon structure.

7. The method of producing a carbon nanotube according to claim 6, wherein at least part of said catalyst substance is liquefied by heating said one dimensional carbon structure.

8. The method of producing a carbon nanotube according to claim 5, wherein said one dimensional carbon structure is formed by a vapor-phase deposition method of using a charged particle beam as an excitation source.

9. The method of producing a carbon nanotube according to claim 5, wherein said one dimensional carbon structure is prepared by a vapor-phase deposition method of using an aromatic hydrocarbon compound as a precursor material.

10. The method of producing a carbon nanotube according to claim 5, wherein said one dimensional carbon structure is a resist pattern.

11. A method of producing a transistor, comprising
forming a carbon nanotube structure by
preparing a substrate;
forming a one dimensional carbon structure at a position separated from a surface of said substrate;
preparing a carbon nanotube by making a catalyst substance move in said one dimensional carbon structure; and
crystallizing a trail region of movement of said catalyst in said one dimensional carbon structure, wherein said step of crystallizing converts said trail region to said carbon nanotube structure;

forming a source electrode and a drain electrode on both ends of said carbon nanotube structure, respectively; and forming a gate electrode on said carbon nanotube structure.

12. A method of producing a wiring structure of carbon nanotube, comprising forming a carbon nanotube by preparing a substrate;

forming a one dimensional carbon structure at a position separated from a surface of said substrate;

preparing a carbon nanotube by making a catalyst substance move in said one dimensional carbon structure; and crystallizing a trail region of movement of said catalyst in said carbon structure, wherein said step of crystallizing converts said trail region to said carbon nanotube.

* * * * *